US012560642B2

(12) United States Patent
Antonenko et al.

(10) Patent No.: US 12,560,642 B2
(45) Date of Patent: Feb. 24, 2026

(54) SYSTEM AND METHOD FOR TESTING OPTICAL RECEIVERS

(71) Applicant: Mellanox Technologies, Ltd., Yokneam (IL)

(72) Inventors: Tatyana Antonenko, Rishon LeTsiyon (IL); Yaakov Gridish, Yoqneam Ilit (IL); Tamir Sharkaz, Kfar Tavor (IL); Itshak Kalifa, Bat Yam (IL); Elad Mentovich, Tel Aviv (IL)

(73) Assignee: Mellanox Technologies, Ltd., Yokneam (IL)

( * ) Notice: Subject to any disclaimer, the term of this patent is extended or adjusted under 35 U.S.C. 154(b) by 0 days.

(21) Appl. No.: 18/227,127

(22) Filed: Jul. 27, 2023

(65) Prior Publication Data

US 2023/0408573 A1      Dec. 21, 2023

Related U.S. Application Data

(62) Division of application No. 17/083,922, filed on Oct. 29, 2020, now abandoned.

(51) Int. Cl.
*G01R 31/26* (2020.01)
*G01R 1/04* (2006.01)
*H01S 5/00* (2006.01)

(52) U.S. Cl.
CPC ....... *G01R 31/2642* (2013.01); *G01R 1/0441* (2013.01); *H01S 5/0021* (2013.01)

(58) Field of Classification Search
CPC .......................... G01R 31/2642; G01R 1/0441
See application file for complete search history.

(56) References Cited

U.S. PATENT DOCUMENTS

| | | | | |
|---|---|---|---|---|
| 5,548,399 | A | * | 8/1996 | Takai ..................... H04B 10/07 |
| | | | | 714/704 |
| 6,863,453 | B2 | | 3/2005 | Wang et al. |
| 7,209,621 | B2 | | 4/2007 | Glebov et al. |
| 7,302,186 | B2 | | 11/2007 | Light et al. |
| 7,863,912 | B2 | | 1/2011 | Byers et al. |
| 8,938,164 | B2 | | 1/2015 | Gao et al. |
| 9,599,785 | B2 | | 3/2017 | Xu et al. |
| 10,014,942 | B2 | | 7/2018 | Coffey et al. |
| 10,203,366 | B2 | | 2/2019 | Berlak et al. |
| 2002/0025100 | A1 | | 2/2002 | Laprise et al. |
| 2004/0166905 | A1 | | 8/2004 | Cherniski et al. |
| 2005/0265717 | A1 | | 12/2005 | Zhou |
| 2006/0269283 | A1 | | 11/2006 | Iwadate |

* cited by examiner

*Primary Examiner* — Paresh Patel
(74) *Attorney, Agent, or Firm* — Moore & Van Allen PLLC; Michael M. McCraw

(57) ABSTRACT

Disclosed are a testing unit, system, and method for testing and predicting failure of optical receivers. The testing unit and system are configured to apply different values of current, voltage, heat stress, and illumination load on the optical receivers during testing. The test methods are designed to check dark current, photo current, forward voltage, and drift over time of these parameters.

14 Claims, 8 Drawing Sheets

SYSTEM AND METHOD FOR TESTING OPTICAL RECEIVERS

CROSS-REFERENCE TO RELATED APPLICATIONS

This application is a divisional of U.S. application Ser. No. 17/083,922, filed Oct. 29, 2020, the content of which application is hereby incorporated by reference herein in its entirety.

FIELD OF THE INVENTION

The invention is from the field of testing optoelectronic devices. Specifically the invention relates to a system and method for testing optical receivers, for example photodiodes, in order to predict failure of the optical receiver.

BACKGROUND OF THE INVENTION

Optical communication systems, such as those used in data centers, include optical transmitters, e.g. vertical-cavity surface-emitting lasers (VCSELs) and optical receivers, e.g. photodiodes, which transmit and receive optical signals via optical cables. One of the causes of failures in optical system is random failure of photodiodes.

Prior art photodiode testing systems are designed to perform different modes of burn-in testing. These testing modes typically involve applying various regimens of stress, e.g. elevated voltages, to photodiodes under different environmental conditions for extended periods of time to evaluate their performance. Examples of commercially available systems for testing photodiodes using these methods are manufactured by Electron Test Equipment Limited of Dublin Ireland and MKS Instruments, Inc. of Andover, Massachusetts, U.S.A.

The function of a photodiode in an optical communication system is to convert incoming light, for example from a VCSEL, to electronic signals. Adding light during the test will cause additional stress to the component and will better simulate the working conditions of PD dies inside modules. To the best of the inventor's knowledge currently commercially available testing systems do not take into account the influence of incident light on the performance and reliability of photodiodes.

It is a purpose of the present invention to provide a system and method of testing photodiodes in order to predict failures.

It is another purpose of the present invention to include incident light on photodiodes during the test in order to cause additional stress to the component and better simulate the working conditions of the photdiode inside modules.

Further purposes and advantages of this invention will appear as the description proceeds.

SUMMARY OF THE INVENTION

In a first aspect the invention is a testing unit for use in a system for testing and predicting failure of optical receivers. The testing unit comprises:
   a) a testing board configured to support at least one socket, wherein the at least one socket is configured to be coupled to a substrate configured to support at least one optical receiver; and
   b) an emitter board configured to support at least one optical emitter.

The emitter board is supported adjacent to the testing board such that the emitter board is substantially parallel to the testing board and each of the one or more optical emitters on the emitter board is substantially aligned with a corresponding socket of the testing board.

Embodiments of the testing unit comprise at least one support rail configured to support and attach the emitter board onto the testing board.

Embodiments of the testing unit comprise an edge connector on the emitter board, the edge connector configured to allow electrical communication between components on the emitter board and other components of the system.

Embodiments of the testing unit comprise a first connector located on the emitter board configured to allow electrical communication between the at least one optical emitter and the first connector.

Embodiments of the testing unit comprise a second connector configured to mate with the first connector located on the emitter board and to electrically connect the at least one optical emitter on the emitter board to the testing board.

Embodiments of the testing unit comprise electrical traces on the testing board configured to allow electrical communication between edge connector and the optical receivers on the substrates in the sockets on the testing board and to allow electrical communication between the emitters on the emitter board and the edge connector via the second connector.

In embodiments of the testing unit the optical receivers are photodiodes.

In embodiments of the testing unit the one or more optical emitters on the emitter board are configured to provide an illumination load on the at least one optical receiver on the testing board.

In embodiments of the testing unit the at least one socket is arranged on a top surface of the testing board.

In embodiments of the testing unit the at least one optical emitter is arranged on a bottom surface of the emitter board In embodiments of the testing unit the electrical traces on the testing board are configured to allow electrical signals related to one or more testing methods to be sent from the edge connector to each of the optical receivers on the testing board and allow various parameters or outputs to be transmitted as electrical signals from each of the optical receivers to the edge connector. In these embodiments the parameters or outputs of the optical receivers are at least one of: an output voltage, an output current, and an operating temperature.

In embodiments of the testing unit the optical emitters are one of: vertical-cavity surface-emitting lasers (VCSELs), light emitting diodes (LEDs), and arrays of LEDs.

In embodiments of the testing unit, when the testing unit is in an operational configuration, in which the bottom surface of the emitter board is substantially aligned with the testing board, the emitter board supports the same number of optical emitters as the number of sockets supported by the corresponding testing board and the configuration or orientation of these optical emitters matches that of the orientation of sockets of the testing board so as allow for optical communication between each optical emitter and the optical receivers in the socket beneath it.

In a second aspect the invention is a system for testing and predicting failure of optical receivers. The system comprises:
   a) at least one testing unit according to the first aspect;
   b) at least one driver in electrical communication with a plurality of optical receivers in one or more sockets on the testing board of the at least one testing unit and in electrical communication with the one or more optical emitters on the emitter board of the at least one testing unit via the end connector and electrical traces on the testing board; the driver configured to apply a voltage input to at least one optical receiver, to activate at least one optical emitter that is in optical communication with the at least one optical receiver, and to monitor a corresponding output parameter from the at least one optical receiver;

c) at least one control unit configured to execute or otherwise control the operation of the testing methods and procedures applied to the optoelectronic components supported by the testing unit via the at least one driver;

d) at least one power supply configured to supply electrical power to the at least one driver and to the control unit; and e) electrical connections configured to allow electrical communication between the components of the system.

Embodiments of the system comprise at least one backplane element configured to support and be in electrical communication with the at least one testing unit; wherein, any number of testing units are supported by a backplane element and/or the system includes any number of additional backplane elements.

Embodiments of the system do not include a backplane element and the testing unit is directly connected to a driver or to a control unit.

In embodiments of the system the drivers include circuitry and/or optoelectronic elements configured to multiplex outputs signals received by the driver from testing units into a combined signal for transmission over a shared transmission medium to a control unit or other device in electrical communication with the driver.

In embodiments of the system the at least one driver is further configured to determine a pass state or a fail state of any number of a plurality of optical receivers based on a comparison of various output parameters to corresponding output parameter thresholds.

In embodiments of the system the control unit is in electrical communication with at least one sensor to monitor or control input, output, and/or ambient conditions of the system, wherein the at least one sensor is selected from the following: thermometers, pressure sensors, humidity sensors, accelerometers, photo resistors, and barometers.

In embodiments of the system the control unit operates as a computer or computer program product. In these embodiments of the system the driver can include some or all of the circuitry or operation of the control unit.

In embodiments of the system the processor includes or is associated with an apparatus comprising:

a) a memory device configured to store various testing procedures, testing parameters, and/or threshold values configured to evaluate the reliability of a photodiode;

b) a processor configured to execute instructions stored in the memory device or otherwise accessible to the processor;

c) a communication interface configured as a device or circuitry embodied in either hardware or a combination of hardware and software that is configured to receive and/or transmit data either using wired or wireless techniques between at least one of: computing devices, servers, drivers, and testing units; and d) a user interface in communication with the processor and configured to receive an indication of a user input and/or to provide an audible, visual, mechanical, or other output to a user.

In these embodiments of the system the driver can include some or all of the circuitry or operation of the control unit.

Embodiments of the system comprise sixteen optical receivers in eight sockets on sixteen testing boards. In these embodiments the system is configured to be controlled by a single control unit; thereby enabling testing, with and without illumination, up to 2048 optical receivers without taking the optical receivers out of the system.

In a third aspect the invention is a method of testing and predicting failure of optical receivers. The method comprises:

A. placing the following components of a system for testing and predicting failure of optical receivers within a temperature controlled oven:

a) a testing board configured to support at least one socket, wherein each socket is configured to receive a substrate configured to support at least one optical receiver; and b) an emitter board configured to support at least one optical emitter;

wherein, the emitter board is supported above the testing board such that the emitter board is substantially parallel to the testing board and each of the one or more optical emitters on the emitter board is substantially aligned with a corresponding socket of the testing board; and B. carrying out all tests without removing the testing board or the emitter board from the oven.

In embodiments of the method the optical receivers are photodiodes.

Embodiments of the method are carried out by a system, which can be manually controlled or programmed to automatically carry out the reliability tests on individual optical receivers in any socket on any testing board.

Embodiments of the method comprise a pre-test comprised of the following steps:

a) check substrate temperature to determine if it is inside a designed operating range of an optical receiver;

b) check that an optical receiver to be tested is present;

c) apply current on the optical receiver and check that a measured voltage is inside a designed operating range of the optical receiver;

d) check for an open or a short circuit and leakage on the optical receiver;

e) in case of fail of any of steps a to d, the test stops.

Embodiments of the method comprise a first test procedure comprised of the following steps:

a) apply reverse voltage on the optical receiver and check that the dark current is inside the designed operating range of the optical receiver;

b) apply reverse voltage on the optical receive, turn on illumination, and check that the photo current is inside the designed operating range of the optical receiver;

c) apply forward current on the optical receiver and check that the forward voltage is inside the designed operating range of optical receiver;

d) in case of fail of any of the steps a to c, the optical receiver is marked as FAIL; and e) in case no failure in steps a to c, document the dark current, photo current, forward voltage, and temperature at Time=0;

wherein in steps a and b the reverse voltage can be applied using different voltage values and in step c the forward current can be applied using different values.

Embodiments of the method comprise a second test procedure, which comprises the following two options:

A) first option is without illumination:

a) raise the temperature of a substrate above ambient;

b) apply a constant reverse voltage on an optical receiver.

c) measure the substrate temperature periodically and check if the temperature is above or below a preset value; and d) if the temperature is above or below a preset value the test stops;

e) measure dark current periodically and check if inside a designed operating range of the optical receiver; and f) in case of fail of step d the optical receiver is marked as FAIL. wherein the test is carried out at a constant temperature.

B) second option with illumination:

a) raise the temperature of a substrate;

b) apply a constant reverse voltage on an optical receiver and turn on illumination;

c) measure substrate temperature periodically and check if the temperature is above or below a preset value;

d) in case of fail the test stops;

e) measure photo current periodically and check if inside the designed operating range of the optical receiver; and f) in case of fail of step e the optical receiver is marked as FAIL.

Embodiments of the method comprise a third test procedure comprised of the following steps:

a) apply reverse voltage on an optical receiver and check that the dark current is inside the designed operating range of the optical receiver;

b) apply reverse voltage on optical receiver, turn on illumination, and check that the photo current is inside a designed operating range of the optical receiver;

c) apply forward current on the optical receiver and check that the forward voltage is inside the designed operating range of the optical receiver;

d) in case of fail of any of the steps a to c, the optical receiver is marked as FAIL;

e) in case no failure in steps a to c, document the dark current, photo current, forward voltage, and temperature at Time=X.

f) determine drift of dark current, photo current, and forward voltage between Time=O and Time=X and check if inside a designed limit for the optical receiver; and g) in case the drift of one or more of the parameters is outside the designed limit the optical receiver is marked as FAIL;

wherein:

i) in steps a and b the reverse voltage can be applied using different voltage values and in step c the forward current can be applied using different current values; and ii) when computing the drift in step d the temperature and illumination conditions should be same at time=0 and time=X.

In embodiments of method the first test procedure, the second test procedure, and the third test procedure are run consecutively. In these embodiments the data in the database from the first procedure can be used for Time=0 in step f of the third procedure.

In embodiments of method the second test procedure and the third test procedure are repeated cyclically. In these embodiments any measurement can be used as Time=0 allowing drift to be determined in step f of the third procedure.

All the above and other characteristics and advantages of the invention will be further understood through the following illustrative and non-limitative description of embodiments thereof, with reference to the appended drawings.

DETAILED DESCRIPTION OF EMBODIMENTS OF THE INVENTION

Figure 1:
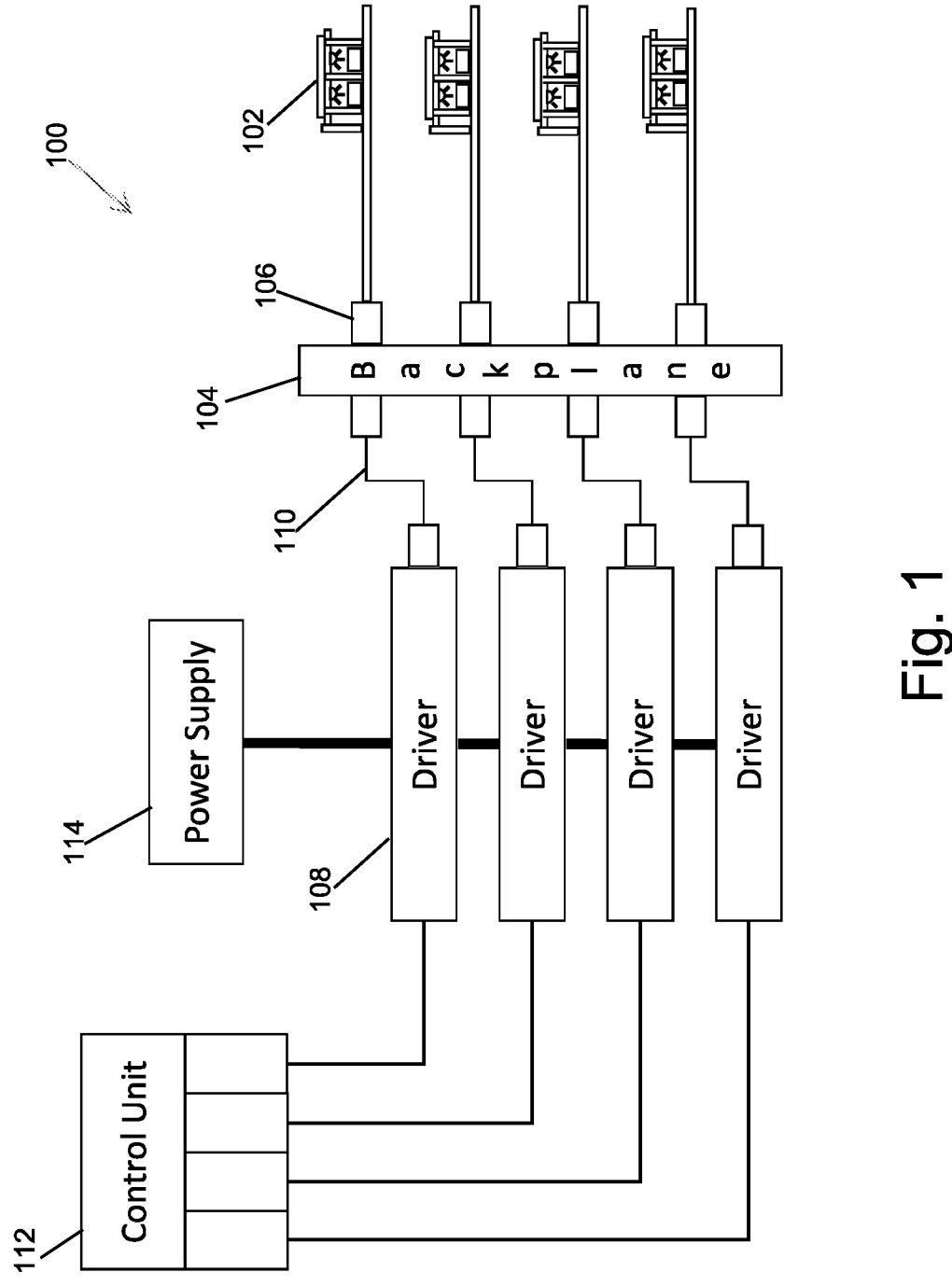
FIG. 1 schematically shows a diagram of a system for testing optical receivers in accordance with the present invention.

FIG. 1 schematically shows a system 100 for testing and predicting failure of optical receivers. System 100 includes testing units 102, backplane elements 104, drivers 108, a control unit 112, and a power supply 114. The testing units 102 include or otherwise support various optoelectronic components, such as optical emitters and optical receivers, so that one or more testing procedures may be performed on the optoelectronic components supported thereon. As shown, in some embodiments, a testing unit 102 may be supported by a backplane element 104 such that the backplane element 104 is in electrical communication with the testing unit 102. To establish and maintain electrical communication, in some embodiments, the testing unit may include an edge connector 106 configured to be received by a corresponding connector of the backplane element 104. The connection between the backplane element 104 and the testing unit 102 is such that electrical signals may flow between them. Additionally, and as shown in FIG. 1, the backplane element 104 may also be configured to support one or more testing units 102 where each testing unit may define a corresponding edge connector 106 in order to electrically connect with the backplane element 104. While reference hereinafter may be made to one testing unit 102 and/or one corresponding backplane element 104, the present disclosure contemplates that any number of testing units 102 may be supported by a backplane element 104 and/or that the system 100 may include any number of additional backplane elements 104. Furthermore, in some embodiments, the system 100 may not include a backplane element 104 such that the testing unit may be directly connected to a driver 108 or a control unit 112. Said another way, the present disclosure contemplates that any number of structural support elements (e.g., datacenter racks, cabinets, testing chambers, ovens, or the like) may function to support the testing unit 102 and/or may facilitate electrical connection between the testing unit 102 and an electrical or current input device (e.g., the driver 108) and/or may function to control values of parameters of environmental conditions surrounding testing unit 102 (e.g. the temperature).

Driver 108 is configured to generate inputs (e.g., a voltage input) that are applied to optoelectronic components (e.g., photodiodes) supported by the testing unit 102. For example, the driver 108 may be configured to generate and apply a stress current or voltage to the testing unit 102 supported by the backplane 104. The driver 108 is in electrical communication with a plurality of optical receivers (e.g., a plurality of optical receivers 502 in FIG. 5) in one or more sockets (e.g., one or more sockets 302 in FIG. 3) and in electrical communication with the one or more optical emitters (e.g., one or more optical emitters 314 in FIG. 3) on the emitters board (e.g., a emitter board 304 in FIG. 3). The driver 108 is configured to apply a voltage input to at least one optical receiver and to monitor a corresponding output parameter (e.g., output voltage, operating temperature, etc.). Further, the driver 108 is configured to receive electrical signals output by the testing unit 102 that may be directed to a control unit 112 described herein below. Furthermore, the driver 108 may include circuitry and/or optoelectronic elements (e.g., a multiplexer) configured to multiplex outputs signals received by the driver 108 from the testing unit 102 into a combined signal for transmission over a shared transmission medium (e.g. an optical fiber or the like) to a control unit 112 or other device in electrical communication with the driver 108. In some embodiments, the driver 108 may be further configured to determine a pass state or a fail state of any number of a plurality of optical receivers based on a comparison of various output parameters to corresponding output parameter thresholds.

In some embodiments, the driver 108 may be in electrical communication with the backplane element 104 via a rigid-flex printed circuit board (PCB) 110. Additionally, in some embodiments, the system 100 may include one or more drivers 108 configured to provide inputs to one or more testing units 102. By way of example, in some embodiments, the number of drivers 102 used by the system 100 may correspond to the number of testing units 102 used by the system such that each driver 108 provides an input to a corresponding testing unit 102. By way of a more particular example as shown in FIG. 1, in some embodiments, the system 100 may include four (4) drivers 108 each in electrical communication with a backplane element 104 and a corresponding testing unit 102. While illustrated with the driver 108 providing inputs to only one corresponding testing unit 102, the present disclosure contemplates that any number of drivers may provide inputs to any number of testing units 102. Said another way, one driver 108 may provide inputs to multiple testing units 102 and/or multiple drivers 108 may provide inputs to a single corresponding testing unit 102.

In some embodiments, the system 100 may also include a control unit 112 configured to execute or otherwise control the operation of the testing methods and procedures applied to the optoelectronic components supported by the testing unit 102. In some embodiments, the control unit 112 may be in electrical communication with the driver 108 such that electrical signals may be provided to the driver 108 (e.g., voltage inputs) and electrical signals may be provided from the driver 108 to the control unit 112 (e.g., output parameters, multiplex signals, or the like). As would be understood by one or ordinary skill in the art in light of the present disclosure, with reference in particular to the description of below FIG. 3, the control unit 112 may operate as a computer or computer program product. In particular, the control unit 112 may be configured to execute one or more testing methods (e.g., measurements, algorithms, protocols, or the like) by directing or otherwise controlling operation of the driver 108. Thus, the control unit 112 may provide commands to the driver 108 to apply various inputs (e.g., voltages) to the testing unit 102 and may receive output data (e.g., electrical signals) from the testing unit 102 via the driver 108.

Furthermore, the control unit 112 may be configured to monitor or control various other variables or parameters of the system 100. For example, the control unit 112 may be in electrical communication with one or more sensors (e.g., thermometers, pressure sensors, humidity sensors, accelerometers, photo resistors, barometers, and the like) so as to monitor input, output, and/or ambient conditions of the system 100. For example, the control unit 112 may monitor the ambient temperature of the system 100 and/or the output temperature of one or more optoelectronic components (e.g., when subjected to a voltage input) via electrical communication with one or more thermometers. Although described herein with respect to the control unit 112 executing testing methods or procedures via input commands to the driver 108, the present disclosure contemplates that the driver 108 may also include some or all of the circuitry or operation of the control unit 112. Said another way, the driver 108 may be integral to the control unit 112 in physical structure and/or operation. Similar to the backplane element 104 and the driver 108 above, in some embodiments, the system 100 may comprise one or more control units 112 configured to direct the operation of one or more drivers 108. In any embodiment described herein, the system 100 may include one or more power supplies 114 configured to provide power to one or more of the control unit 112 and/or the driver 108.

Figure 2:
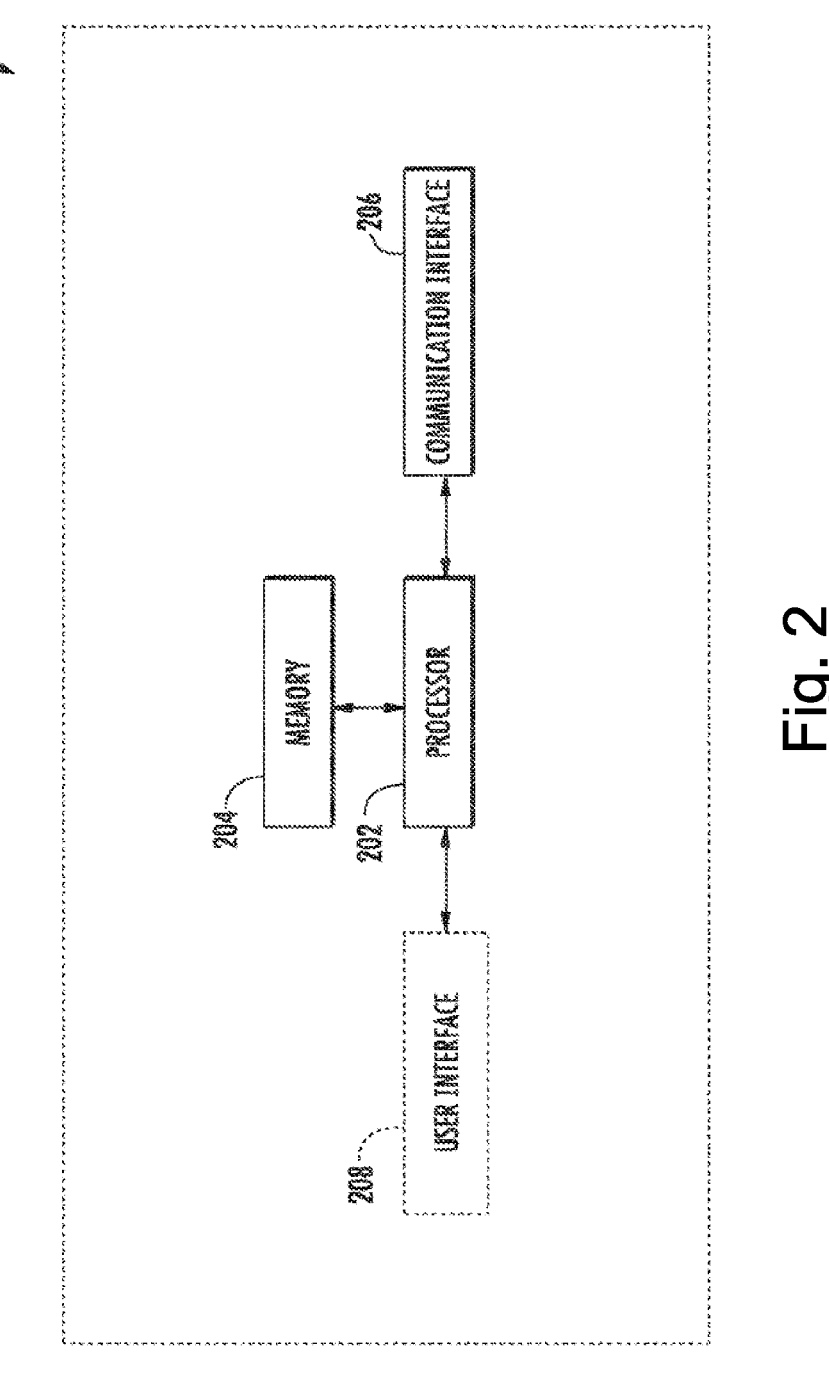
FIG. 2 schematically shows a block diagram of an example apparatus that may be configured in accordance with some embodiments discussed herein.

Regardless of the type of device that embodies the control unit 112 or the driver 108, the control unit 112 and/or driver 108 may include or be associated with an apparatus 200 as shown in FIG. 2. In this regard, the apparatus 200 may include or otherwise be in communication with a processor 202, a memory device 204, a communication interface 206, and/or a user interface 208. As such, in some embodiments, although devices or elements are shown as being in communication with each other, hereinafter such devices or elements should be considered to be capable of being embodied within the same device or element and thus, devices or elements shown in communication should be understood to alternatively be portions of the same device or element.

In some embodiments, the processor 202 (and/or co-processors or any other processing circuitry assisting or otherwise associated with the processor) may be in communication with the memory device 204 via a bus for passing information among components of the apparatus 200. The memory device 204 may include, for example, one or more volatile and/or non-volatile memories. In other words, for example, the memory device 204 may be an electronic storage device (e.g., a computer readable storage medium) comprising gates configured to store data (e.g., bits) that may be retrievable by a machine (e.g., a computing device like the processor). The memory device 204 may be configured to store information, data, content, applications, instructions, or the like for enabling the apparatus 200 to carry out various functions in accordance with an example embodiment of the present invention. In this regard, the memory device 204 may store various testing procedures, testing parameters, and/or threshold values configured to evaluate the reliability of a photodiode as discussed below. For example, the memory device 204 could be configured to buffer input data for processing by the processor 202. Additionally or alternatively, the memory device 204 could be configured to store instructions for execution by the processor 202.

As noted above, the apparatus 200 may be embodied by the driver 108 or the control unit 112 configured to be utilized in an example embodiment of the present invention. However, in some embodiments, the apparatus 200 may be embodied as a chip or chip set. In other words, the apparatus 200 may comprise one or more physical packages (e.g., chips) including materials, components and/or wires on a structural assembly (e.g., a baseboard). The structural assembly may provide physical strength, conservation of size, and/or limitation of electrical interaction for component circuitry included thereon.

The processor 202 may be embodied in a number of different ways. For example, the processor 202 may be embodied as one or more of various hardware processing means such as a coprocessor, a microprocessor, a controller, a digital signal processor (DSP), a processing element with or without an accompanying DSP, or various other processing circuitry including integrated circuits such as, for example, an ASIC (application specific integrated circuit), an FPGA (field programmable gate array), a microcontroller unit (MCU), a hardware accelerator, a special-purpose computer chip, or the like.

In an example embodiment, the processor 202 may be configured to execute instructions stored in the memory device 204 or otherwise accessible to the processor 202. Alternatively or additionally, the processor 202 may be configured to execute hard coded functionality. As such, whether configured by hardware or software methods, or by a combination thereof, the processor 202 may represent an entity (e.g., physically embodied in circuitry) capable of performing operations according to an embodiment of the present invention while configured accordingly. Thus, for example, when the processor 202 is embodied as an ASIC, FPGA or the like, the processor 202 may be specifically configured hardware for conducting the operations described herein. Alternatively, as another example, when the processor 202 is embodied as an executor of software instructions, the instructions may specifically configure the processor 202 to perform the algorithms and/or methods described herein when the instructions are executed. However, in some cases, the processor 202 may be a processor 202 of a specific device (e.g., a control unit 112 or driver 108 as shown in FIG. 1) configured to be employed by an embodiment of the present invention by further configuration of the processor 202 by instructions for performing the algorithms and/or operations described herein.

Meanwhile, the communication interface 206 may be any means such as a device or circuitry embodied in either hardware or a combination of hardware and software that is configured to receive and/or transmit data between computing devices and/or servers. For example, the communication interface 206 may be configured to communicate wirelessly with the one or more drivers 108 and/or testing units 102, such as via Wi-Fi, Bluetooth, or other wireless communications techniques. In some instances, the communication interface may alternatively or also support wired communication. For example, the communication interface 206 may be configured to communicate via wired communication with other components of the driver 108 and/or testing unit 102.

In some embodiments, the apparatus 200 may optionally include a user interface 208 in communication with the processor 202, such as by user interface circuitry, to receive an indication of a user input and/or to provide an audible, visual, mechanical, or other output to a user. As such, the user interface 208 may include, for example, a keyboard, a mouse, a display, a touch screen display, a microphone, a speaker, and/or other input/output mechanisms. The user interface may also be in communication with the memory 204 and/or the communication interface 206, such as via a bus.

Figure 3:
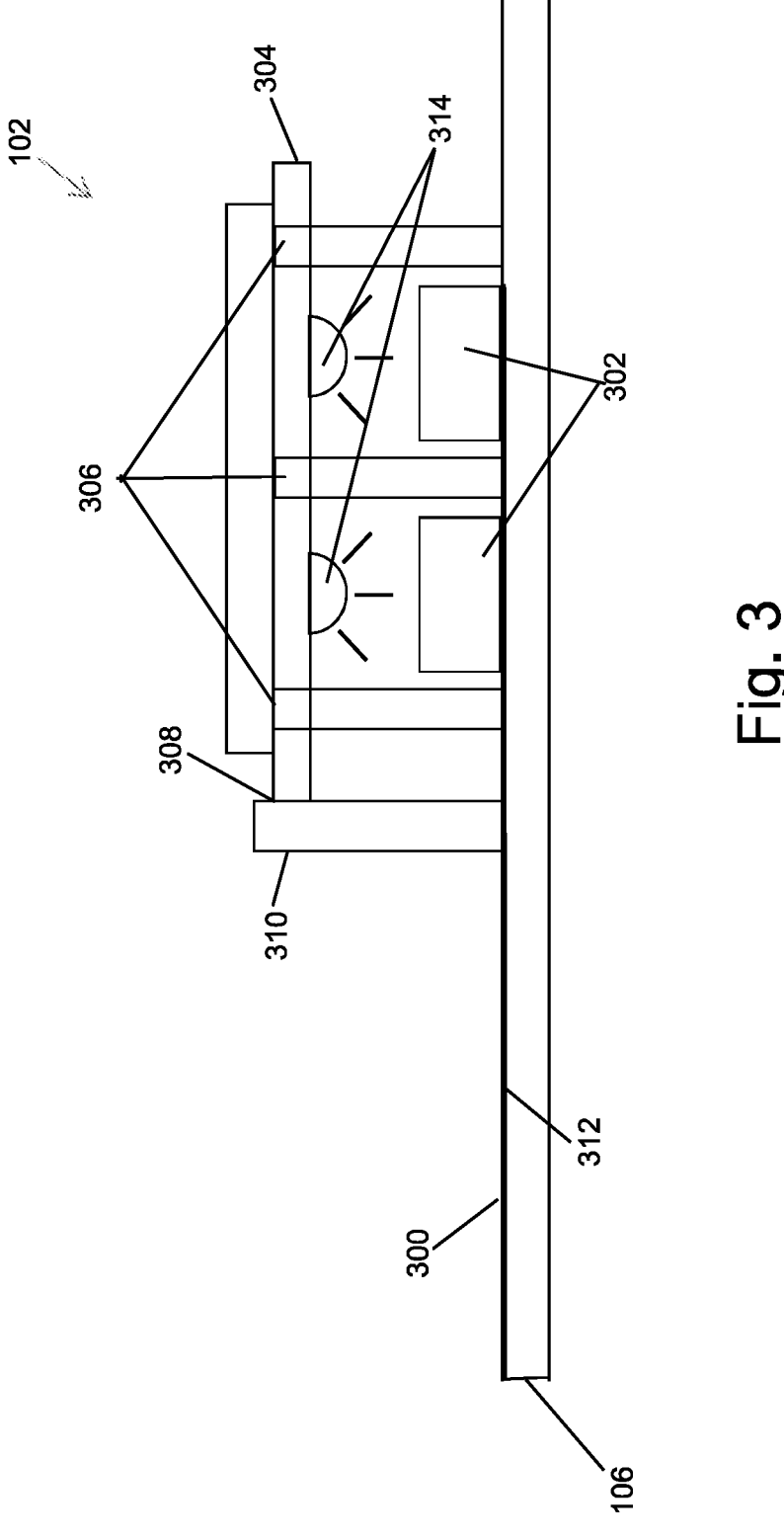
FIG. 3 schematically shows a side view of a testing unit in accordance with some embodiments discussed herein.

With reference to FIG. 3, a testing unit 102 of the system 100 is schematically illustrated. As shown, the testing unit 102 may include a testing board 300, an emitter board 304, one or more support rails 306, and an edge connector 106. As shown, in some embodiments, the testing board 300 may be configured to support one or more sockets 302 via a top surface of the testing board 300. As described hereinafter with reference to FIGS. 4-7, each of the one or more sockets 302 may receive a substrate supporting one or more optical receivers for receiving optical signals (e.g., a substrate 500 and an optical receiver 502 in FIG. 5). The testing board 300 of the testing unit 102 may include a substrate, circuit board, or any other support structure which allows electrical signals to be directed to the socket 302, and subsequently to the optical receivers supported thereon, from the driver 108 via the backplane 104 (in FIG. 1). In particular, the testing board may define one or more electrical traces, connections, or the like configured to allow electrical communication between the plurality of optical receivers (e.g., optical receivers 502 in FIG. 5) and the driver 108 (see FIG. 1). As described above with reference to FIG. 1, the testing board 300 (e.g., of the testing unit 102) may define an edge connector 106 configured to be received by a corresponding connector of the backplane element 104. The connection between the backplane element 104 and the testing unit 102 may be such that electrical signals may flow therebetween.

The testing unit 102 may also include a emitter board 304 supporting one or more optical emitters 314 (e.g., LEDs) via a bottom surface of the emitter board 304. As described more fully hereinafter, the one or more optical emitters may be configured to transmit optical signals to be received by a plurality of optical receivers, which are configured to convert the optical signals to corresponding electrical signals. As shown in FIG. 3, the one or more optical emitters 314 may be in optical communication via alignment of the testing board 300 with the emitter board 304. For example, the testing unit 102 may be configured such that the top surface of the testing board 300 supporting the one or more sockets 302 is disposed opposite the bottom surface of the testing board 300 supporting the one or more optical emitters 314.

The testing unit 102 may further include one or more support rails 306 attached to one of the testing board 300 or the emitter board 304, and the one or more support rails 306 may be configured to attach the testing board 300 to the emitter board 304. While illustrated with three (3) support rails 306 in FIG. 3, the present disclosure contemplates that any number of support rails may be used in any configuration. Additionally, the support rails 306 may be attached to either one of the emitter board 304 or testing board 300 so long as the one or more support rails 306 may be configured to substantially align each of the one or more optical emitters 314 of the emitter board with a corresponding socket 302 of the testing board 300 such that optical signals transmitted by an optical emitter (e.g., an optical emitter 314 in FIG. 3) of the emitter board 304 may be received by the corresponding optical receiver 502 of the socket 302 when the testing unit 102 is in an operational configuration. Still further, the emitter board 304 may also be disposed substantially parallel with respect to the testing board 300 via the support rails 306 and located such that the distance between the emitter board 304 and the socket 302 of the testing board 300 is, for example, less than 9.33 mm; but in general will depend on the type of optical emitter 314 being used.

In an embodiment, the emitter board 304 will comprise a LED array e.g. 4×4 or 6×6, positioned above each socket 302 on testing board 300. This source will assure that each point inside the socket area containing the photodiodes 502 will receive the same light intensity during a test. In some embodiments, and as shown in FIG. 3, the testing board 300 may include a first connector 310 (e.g. a female connector) configured to receive a corresponding second connector 308 (e.g. a male connector) defined by the emitter board 304. The connection between first connector 310 and the corresponding second connector 308 may facilitate securing and aligning the sensor emitter 304 with respect to the testing board 300 such that optical communication between the one or more optical emitters 314 and the plurality of optical receivers 502 (e.g., shown in FIG. 5) received by the socket 302 are maintained. As would be understood by one of ordinary skill in the art in light of the present disclosure, each of the testing board 300 or the emitter board 304 may define any attachment mechanism (e.g., snaps, grooves, or the like) in order to secure the emitter board 304 to the testing board 300.

Figure 4:
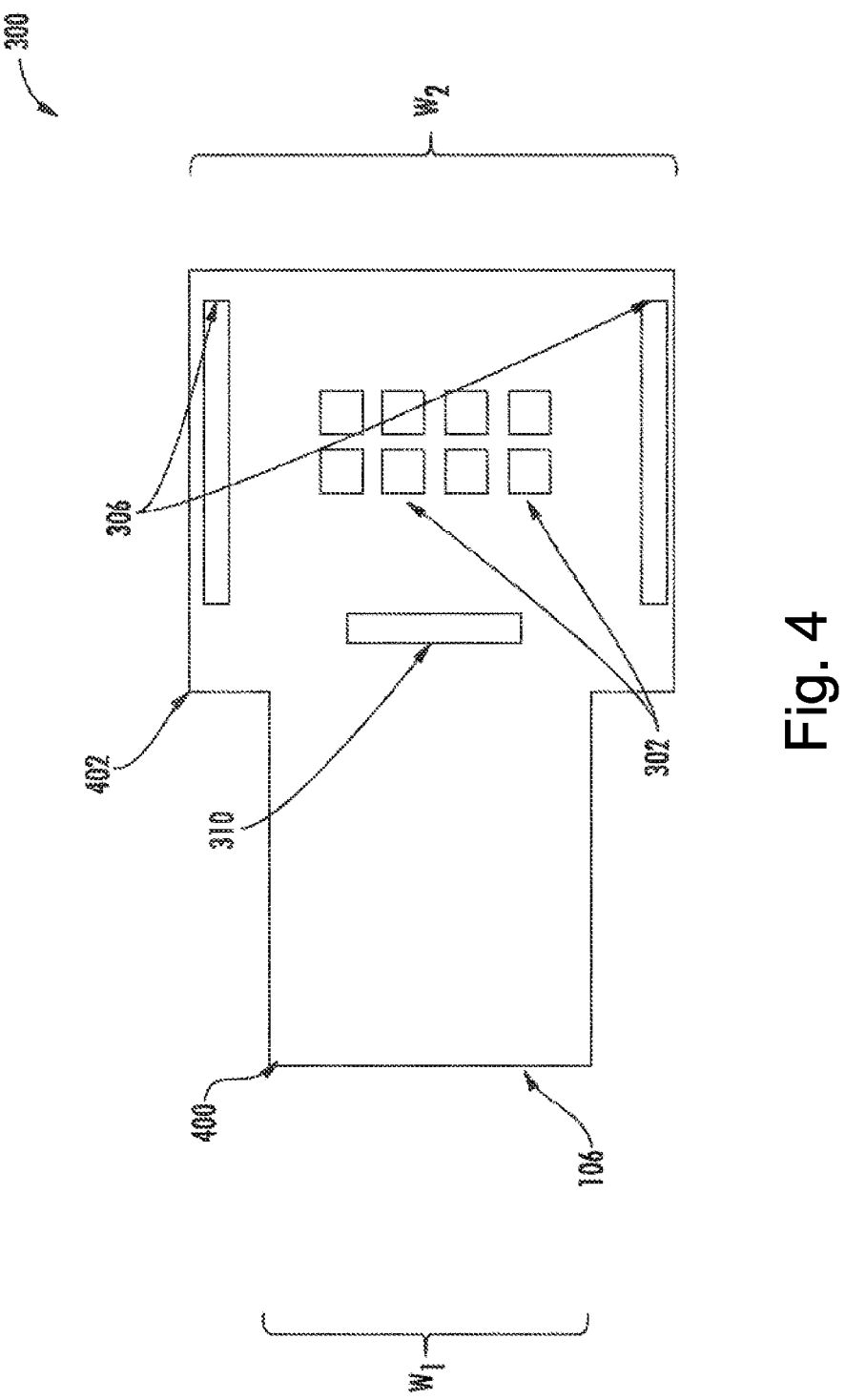
FIG. 4 symbolically shows a top view of a testing board of FIG. 1 in accordance with some embodiments discussed herein.

With reference to FIG. 4, a top view of a testing board 300 configured to support eight (8) optical receivers (not shown) via eight (8) sockets 302 is illustrated. In some embodiments, the testing board 300 may be configured (e.g., sized and shaped) so as to form a connecting portion 400 and a testing portion 402. In such an embodiment, the connecting portion 400, including the edge connector 106 described above with reference to FIGS. 1-2, may define a first width $W_1$, and the testing portion 402 may define a second width $W_2$. As shown in FIG. 4, the first width $W_1$ of the connection portion 400 may be less than the second width $W_2$ of the testing portion 402 so as to form a T-shaped testing board 300. While described with reference to a T-shaped testing board 300 with eight (8) sockets 302, the present disclosure contemplates that any number of sockets 302 may be supported by the testing board 300 in any configuration. Furthermore, the present disclosure contemplates that the testing board 300 may be any shape or size so as to be received by a corresponding backplane element (e.g., backplane element 104 in FIG. 1).

Figure 5:
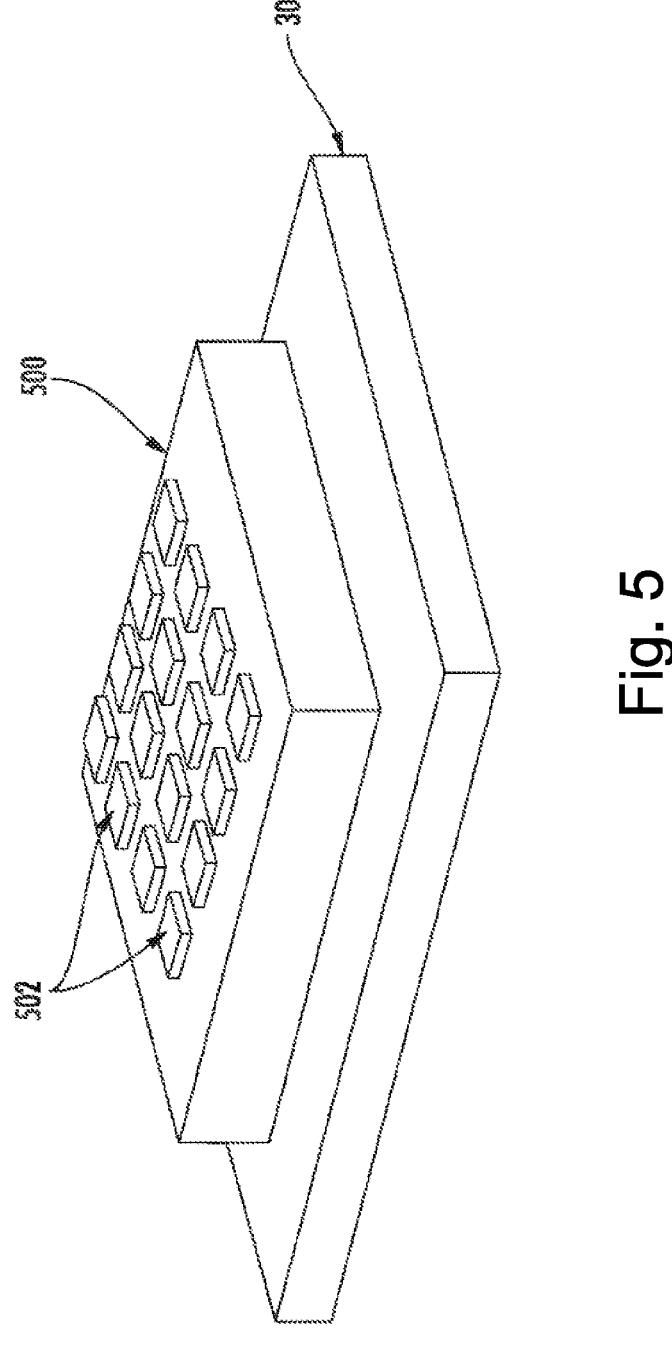
FIG. 5 symbolically shows a perspective view of a socket, substrate, and plurality of optical receivers in accordance with some embodiments discussed herein.
Figure 6:
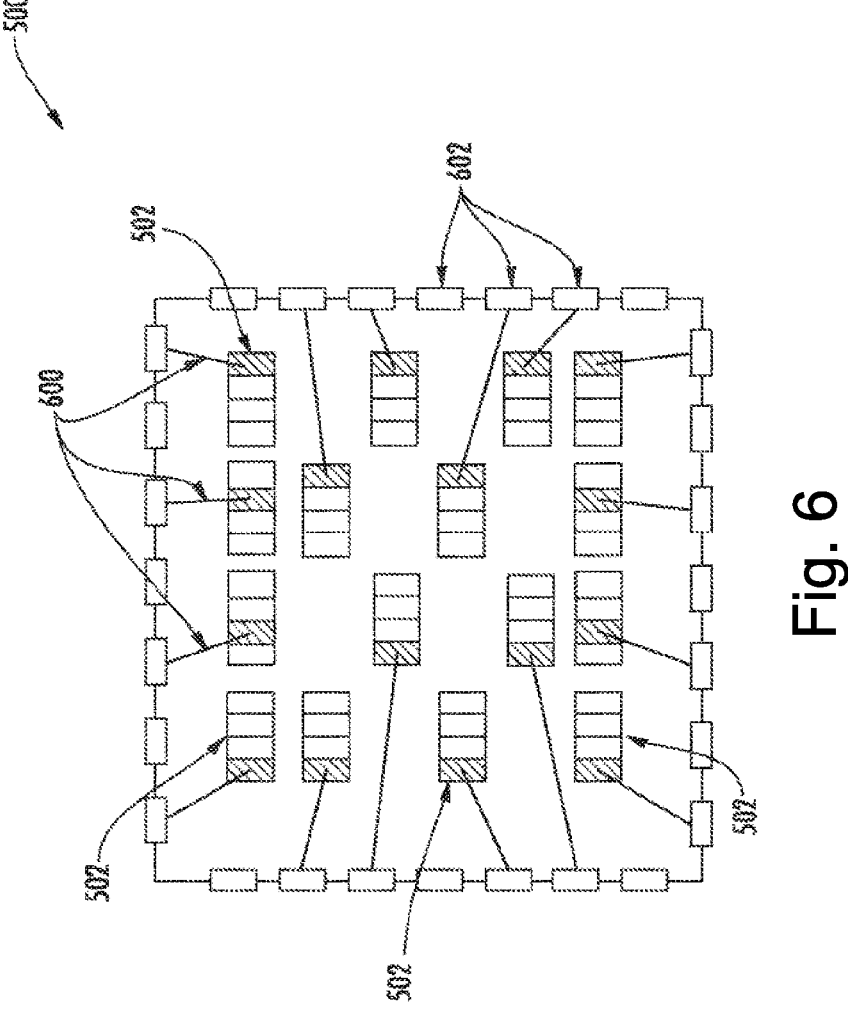
FIG. 6 symbolically shows a top view of a substrate of FIG. 4 in accordance with some embodiments discussed herein.
Figure 7:
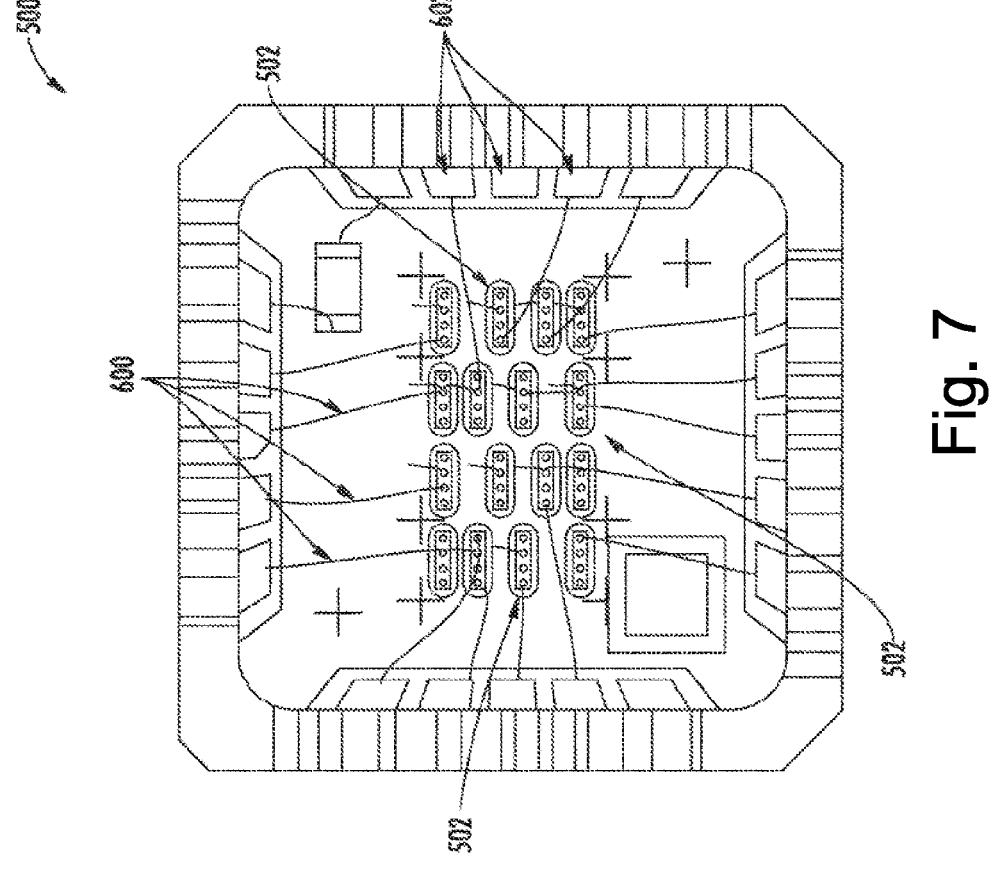
FIG. 7 symbolically shows a top view of a particular configuration of the substrate of FIG. 4 in accordance with some embodiments discussed herein.

With reference to FIGS. 5-7, a socket 302 configured to receive a substrate 500 supporting a plurality of optical receivers 502 (e.g., photodiodes) is illustrated. As shown, the substrate 500 may be configured to be received by a socket 302 such that electrical signals received by the socket 302 (e.g., via electrical communication with the testing board 300) may be transmitted from the socket 302 to the substrate 500, and further transmitted to a plurality of optical receivers 502 supported thereon. The plurality of optical receivers 502 are configured to convert the optical signals received from the optical emitters 314 to corresponding electrical signals. As shown in FIG. 7, the plurality of optical receivers 502 may be connected with a contact point 602 of the substrate 500 via one or more wire bonds 600. As described hereinafter with regard to one or more testing methods applied to the plurality of optical receivers 502, the connection of at least one optical receivers 502 with a corresponding contact point 602 via the wire bond 600 may allow various parameters or outputs (e.g., an output voltage, an output current, an operating temperature, etc.) to be transmitted as electrical signals from the respective optical receiver 502 to a control unit (e.g., the control unit 112 in FIG. 1) for analysis. In some embodiments, the substrate 500 received by the socket 302 may support sixteen (16) optical receivers (e.g., photodiodes). While described in reference to sixteen (16) optical receivers 502 supported by a single substrate 500, the present disclosure contemplates that any number of optical receivers 502 may be supported by a corresponding substrate 500 in any configuration. Furthermore, with reference to FIGS. 6-7, the present disclosure contemplates that any orientation or configuration of wire bonds 600 and contact points 602 may be unitized by embodiments of the present invention such that one or more of the plurality of optical receivers 502 is in electrical communication with a driver (e.g., driver 108).

Figure 8:
FIG. 8 symbolically shows a bottom view of the emitters board of FIG. 3 in accordance with some embodiments discussed herein.
Figure 8:
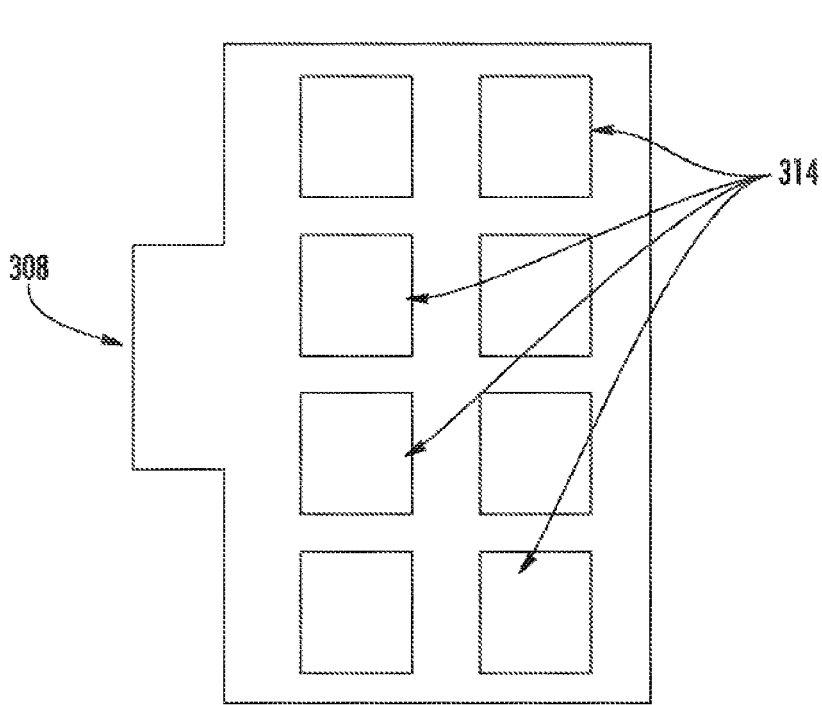

With reference to FIG. 8, a bottom view of the emitter board 304 is schematically illustrated. As shown, the bottom surface of the emitter board 304 may be configured to support one or more optical emitters 314 (e.g., VCSELs, LEDs, LED arrays). When in an operational configuration, in which the bottom surface of the emitter board 304 is substantially aligned with the testing board 300, each optical emitter 314 may be configured to transmit optical signals to the plurality of optical receivers 502, which are configured to convert the optical signals to corresponding electrical signals. In some embodiments, the emitter board 304 may support eight (8) optical emitters 314. However, the present disclosure contemplates that any number of optical emitters 314 may be supported by the emitter board 304 so as to transmit optical signals to the plurality of optical receivers 502 provided in the corresponding sockets 302 of the testing board 300. As would be evident to one of ordinary skill in the art in light of the present disclosure, the emitter board 304, in some embodiments, may support the same number of optical emitters 314 as the number of sockets 302 supported by the corresponding testing board 300. Furthermore the configuration or orientation of these optical emitters 314 may match that of the orientation of sockets 302 of the testing board 300 so as allow for optical communication between the optoelectronic elements supported thereon. In an example embodiment described herein, the emitter board 304 may define eight (8) optical emitters 314 positioned to substantially align with eight (8) corresponding sockets 302 of the testing board 300 such that a set of sixteen (16) optical receivers 502 of each socket 302 is in optical communication with a single corresponding optical emitter 314. Accordingly, in such an embodiment, the emitter board 304 supports eight (8) optical emitters 314 in optical communication with a maximum of one hundred twenty-eight (128) optical receivers 502.

As described below in detail with reference to particular testing methods, the testing system 100 may serve to provide electrical inputs to a plurality of optical receivers 502 and monitor corresponding output parameters. By way of example, with reference to FIGS. 1, 3, and the control unit 112 may execute a testing method by directing the driver 108 to provide a voltage input to at least one of the plurality of optical receivers 502. The control unit 112 may provide this command via electrical signals transmitted to the driver 108. The driver 108 may then provide a corresponding voltage input to the testing unit 102 via electrical signals transmitted by the driver 108 to the testing unit via the rigid-flex PCB 110, the backplane 104, and the edge connector 106 (FIG. 1). The electrical signals may then be provided to at least one optical receiver 502 via electrical traces 312 of the testing board 300, socket 302, and substrate 500. Similarly, the control unit 112 and driver 108 may activate the optical emitters 314 on emitter board 304 to provide light when desired. The optical receiver 502 converts the optical signals to electrical signals that are transferred to control unit 112. The control unit 112 analyses and/or determines various parameters or outputs of the optical receiver 502 based upon these electrical signals to determine passage or failure of the optical receiver. Although described as providing a voltage input to a single optical receiver, the present disclosure contemplates that the control unit 112 and/or driver 108 may selectively apply inputs to any number or combination of the plurality of optical transmitters 502.

A system built according to the above comprises sixteen optical receivers 502 in eight sockets 302 on sixteen testing boards 300 and will be controlled by a single control unit 112 to enable testing, with and without illumination, up to 2048 optical receivers 502 without taking the optical receivers out of the system. This reduces time and optical receiver failure due to handling issues.

Different types of reliability tests will now be outlined that can be carried out using the system described above. As described, the system can be manually controlled or programmed to automatically carry out the different tests on individual optical receiver 502 on any testing board 300 or in any socket 302 in which it is located. Specifically the tests described below are for photodiodes and the PASS/FAIL state that is determined by the test is specific to each photodiode.

Three testing procedures and a pre-test will now be described. Each of the testing procedures is a separate program in memory device 204 of apparatus 200 and may be run separately. However the normal flow for photodiode reliability testing will consist of running the pre-test and then the three test procedures consecutively with procedures two and three repeated cyclically, wherein the overall test time and number of stress intervals can be chosen by the operator. An example of a typical test time is two thousand (2000) hours and number of stress cycles is eight (8).

Pre-Test

This test is carried out before each test procedure if they are carried out separately and only before the first test if the test procedures are carried out sequentially.

a. Check the substrate temperature to determine if it is inside the designed operating range of the optical receiver.

b. Check that the optical receiver to be tested is present.

c. Apply current on the optical receiver and check that the voltage is the designed operating range of the optical receiver.

d. Check for an open or short circuit and leakage on optical receiver.

In case of fail of any of steps a to d the test stops.

A. First Test Procedure

The purpose of this test is to determine the current-voltage (I-V) characteristics of the optical receiver prior to applying stress. This test can be carried out without illumination (steps a and c) and with illumination (step b).

a. Apply reverse voltage on optical receiver (can be applied using different voltage values). Check that the dark current is inside the designed operating range of the optical receiver.

b. Apply reverse voltage on optical receiver (can be applied using different voltage values). Turn on the illumination and check that the photo current is inside the designed operating range of the optical receiver.

c. Apply forward current on optical receiver (can be applied using different current values). Check that the forward voltage is inside the designed operating range of optical receiver.

In case of fail of any of the steps a to c, the optical receiver is marked as FAIL.

Document the dark current, photo current, forward voltage, and temperature at Time=0.

B. Second Test Procedure

The purpose of this test is to check the effect of thermal stress on the optical receiver. The procedure can be carried out in two options—either without or with illumination. The overall concept of this test is to keep photodiodes in a constant temperature environment and under constant reverse voltage for a period of time (e.g. 24 hours). Constant illumination can also be added and, in both options, values of parameters are periodically checked, (e.g. every 10 minutes).

1st option: without illumination a. Raise temperature of the substrate above ambient (in an embodiment this is carried out by locating the testing units 102 in an oven and raising the temperature in the oven)

b. Apply constant reverse voltage on optical receiver.

c. Measure the substrate temperature periodically and check if the temperature is above or below a preset value (note that this test should be carried out at a constant temperature, e.g. 85° C.).

In case of fail the test stops.

d. Measure dark current periodically and check if inside the designed operating range of the optical receiver.

In case of fail of step d the optical receiver is marked as FAIL.

2nd option: with illumination a. Raise temperature of substrate.

b. Apply constant reverse voltage on optical receiver and turn on illumination.

c. Measure substrate temperature periodically and check if the temperature is above or below a preset value.

In case of fail the test stops.

d. Measure photo current periodically and check if inside the designed operating range of the optical receiver.

n case of fail of step d optical receiver is marked as FAIL.

C. Third Test Procedure

The purpose of this test is to check the drift of the I-V characteristics of the optical receiver, with and without illumination, over time. Also if carried out cyclically with the second test procedure the effect of thermal stress on the drift of the I-V characteristics of the optical receiver over time is checked. In this test the parameters are recorded at least at two different times.

a. Apply reverse voltage on optical receiver (can be applied using different voltage values). Check that the dark current is inside the designed operating range of the optical receiver.

b. Apply reverse voltage on optical receiver (can be applied using different voltage values). Turn on the illumination and check that the photo current is inside the designed operating range of the optical receiver.

c. Apply forward current on optical receiver (can be applied using different current values). Check that the forward voltage is inside the designed operating range of the optical receiver.

In case of fail of any of the steps a to c, the optical receiver is marked as FAIL.

Document the dark current, photo current, forward voltage, and temperature at Time=X.

d. Compute the drift of dark current, photo current, and forward voltage between Time=O and Time=X and check if inside the designed limit for the optical receiver.

In case the drift of one or more of the parameters is outside the designed limit the optical receiver is marked as FAIL.

Note that:

i) When computing the drift in step d the temperature and illumination conditions should be same at time=0 and time=X.

ii) The values of the parameters in step d may be used to check the drift relative to measurements at time=0, before any stress is applied. The data in the database from the first procedure can be used for time=0 allowing drift to be computed; but there is an option in program to set any measurement as "time=0", the point relative to which the drift will be computed.

Although embodiments of the invention have been described by way of illustration, it will be understood that the invention may be carried out with many variations, modifications, and adaptations, without exceeding the scope of the claims.

The invention claimed is:

1. A method for testing optical receivers, the method comprising:

placing within a temperature controlled oven:

a testing board configured to support at least one socket, wherein each socket is configured to receive a substrate configured to support at least one optical receiver; and an emitter board configured to support at least one optical emitter, wherein the emitter board is supported above the testing board such that the emitter board is substantially parallel to the testing board and each of the one or more optical emitters on the emitter board is substantially aligned with a corresponding socket of the testing board; and performing one or more testing operations without removal of the testing board or the emitter board from the temperature controlled oven, wherein the one or more testing operations further comprise a second testing procedure comprising:

increasing a temperature of the temperature controlled oven greater than an ambient temperature of the temperature controlled over;

applying an illumination load on the optical receiver;

applying a constant reverse voltage to the optical receiver;

iteratively measuring a substrate temperature to determine if the temperature is above or below a preset value;

iteratively measuring a photo current of the optical receiver to determine if the photo current is inside a designed operating range of the optical receiver;

halting the second testing procedure in an instance in which the substrate temperature is above or below the preset value; and outputting a fail state for the optical receiver in response to halting the second testing procedure.

2. The method according to claim 1, wherein the one or more testing operations further comprise a pre-test procedure comprising:

determining a temperature of the substrate; and outputting a fail state in an instance in which the determined temperature of the substrate is outside an operating range of the optical receiver.

3. The method according to claim 1, wherein the one or more testing operations further comprise a pre-test procedure comprising:

determining an absence of the optical receiver supported by the substrate; and outputting a fail state in response to the absence of the optical receiver.

4. The method according to claim 1, wherein the one or more testing operations further comprise a pre-test procedure comprising:

applying a current to the optical receiver;

measuring a voltage of the optical receiver; and outputting a fail state in an instance in which the measured voltage is outside an operating range of the optical receiver.

5. The method according to claim 1, wherein the one or more testing operations further comprise a pre-test procedure comprising:

determining an open circuit and/or leakage on the optical receiver;

outputting a fail state in response to the determined open circuit and/or leakage.

6. The method according to claim 1, wherein the one or more testing operations further comprise a pre-test procedure comprising:

determining a temperature of the substrate;

determining an absence of the optical receiver supported by the substrate;

applying a current to the optical receiver;

measuring a voltage of the optical receiver;

determining an open circuit and/or leakage on the optical receiver; and outputting a fail state:

in an instance in which the determined temperature of the substrate is outside an operating range of the optical receiver;

in response to the absence of the optical receiver;

in an instance in which the measured voltage is outside an operating range of the optical receiver; or in response to the determined open circuit and/or leakage.

7. The method according to claim 1, wherein the one or more testing operations further comprise another testing procedure comprising:

applying a reverse voltage to the optical receiver;

determining a dark current for the optical receiver;

outputting a fail state in an instance in which the determined dark current is outside of a designed operating range of the optical receiver; and storing the dark current and a temperature at a Time=0 in an instance in which the determined dark current is inside of a designed operating range of the optical receiver.

8. The method according to claim 1, wherein the one or more testing operations further comprise another testing procedure comprising:

applying a reverse voltage to the optical receiver;

providing an illumination load on the optical receiver;

determining a photo current for the optical receiver;

outputting a fail state in an instance in which the determined photo current is outside of a designed operating range of the optical receiver; and storing the photo current and a temperature at a Time=0 in an instance in which the determined photo current is inside of a designed operating range of the optical receiver.

9. The method according to claim 1, wherein the one or more testing operations further comprise another testing procedure comprising:

applying a forward current to the optical receiver;

determining a forward voltage for the optical receiver;

outputting a fail state in an instance in which the determined forward voltage is outside of a designed operating range of the optical receiver; and storing the forward voltage and a temperature at a Time=0 in an instance in which the determined forward voltage is inside of a designed operating range of the optical receiver.

10. The method according to claim 1, wherein the one or more testing operations further comprise another testing procedure comprising:

applying a reverse voltage to the optical receiver;

determining a dark current for the optical receiver;

providing an illumination load on the optical receiver;

determining a photo current for the optical receiver;

applying a forward current to the optical receiver;

determining a forward voltage for the optical receiver;

outputting a fail state in an instance in which:

the determined dark current is outside of a designed operating range of the optical receiver;

the determined photo current is outside of a designed operating range of the optical receiver; and/or the determined forward voltage is outside of a designed operating range of the optical receiver; and storing the dark current, the photo current, the forward voltage, and a temperature at a Time=0 in an instance in which the determined dark current, the photo current, and the forward voltage are inside of a designed operating range of the optical receiver.

11. The method according to claim 1, wherein the one or more testing operations further comprise another testing procedure comprising:

increasing a temperature of the temperature controlled oven greater than an ambient temperature of the temperature controlled over;

applying a constant reverse voltage to the optical receiver;

iteratively measuring a substrate temperature to determine if the temperature is above or below a preset value;

iteratively measuring a dark current of the optical receiver to determine if the dark current is inside a designed operating range of the optical receiver;

halting the second testing procedure in an instance in which the substrate temperature is above or below the preset value; and outputting a fail state for the optical receiver in response to halting the second testing procedure.

12. The method according to claim 11, wherein the operations of the another testing procedure are completed at a constant temperature.

13. The method according to claim 1, wherein the one or more testing operations further comprise another testing procedure comprising:

applying a reverse voltage to the optical receiver;

determining a dark current for the optical receiver;

providing an illumination load on the optical receiver;

determining a photo current for the optical receiver;

applying a forward current to the optical receiver;

determining a forward voltage for the optical receiver;

outputting a fail state in an instance in which:

the determined dark current is outside of a designed operating range of the optical receiver;

the determined photo current is outside of a designed operating range of the optical receiver; and/or the determined forward voltage is outside of a designed operating range of the optical receiver;

storing the dark current, the photo current, the forward voltage, and a temperature at a Time=X in an instance in which the determined dark current, the photo current, and the forward voltage are inside of a designed operating range of the optical receiver;

determining a drift of the dark current, the photo current, and the forward voltage between a Time=0 and the Time=X; and outputting a fail state in an instance in which the drift of the dark current, the drift of the photo current, or the drift of the forward voltage is outside a defined limited for the optical receiver.

14. The method according to claim 13, wherein a value of the applied reverse voltage and a value of the applied forward current is variable.

*    *    *    *    *